(12) United States Patent
Anidjar

(10) Patent No.: US 7,368,975 B2
(45) Date of Patent: May 6, 2008

(54) METHODS AND APPARATUS FOR REDUCED HARDWARE MULTIPLE VARIABLE VOLTAGE GENERATOR

(75) Inventor: Joseph Anidjar, Asbury, NJ (US)

(73) Assignee: Agere Systems Inc., Allentown, PA (US)

( * ) Notice: Subject to any disclaimer, the term of this patent is extended or adjusted under 35 U.S.C. 154(b) by 212 days.

(21) Appl. No.: 11/376,606

(22) Filed: Mar. 15, 2006

(65) Prior Publication Data

US 2007/0216470 A1 Sep. 20, 2007

(51) Int. Cl.
*G11C 5/14* (2006.01)
(52) U.S. Cl. .................. 327/530; 327/535; 327/537; 327/538; 327/540; 327/541; 327/542; 327/543
(58) Field of Classification Search .............. None
See application file for complete search history.

(56) References Cited

U.S. PATENT DOCUMENTS

2005/0195000 A1* 9/2005 Parker et al. ............... 327/143
2006/0044049 A1* 3/2006 Ouellette et al. ........... 327/525
2006/0192598 A1* 8/2006 Baird et al. ................. 327/100
2006/0202744 A1* 9/2006 Utsuno ....................... 327/538

* cited by examiner

*Primary Examiner*—Tuan T. Lam
*Assistant Examiner*—Hiep Nguyen

(57) ABSTRACT

A circuit is described that generates multiple voltages each having a common reference point. The circuit uses a feedback control loop to generate a center voltage, a first voltage generator, and a second voltage generator. The first voltage generator generates a first high voltage related to the center voltage plus a first offset voltage and a first low voltage related to the center voltage minus the first offset voltage, where the first offset voltage is determined by a first control input to the first voltage generator. The second voltage generator generates a second high voltage related to the center voltage plus a second offset voltage and a second low voltage related to the center voltage minus the second offset voltage, where the second offset voltage is determined by a second control input to the second voltage reference generator. An example is also presented where the multiple voltage generator circuit is advantageously employed in a deserializer data acquisition system.

20 Claims, 4 Drawing Sheets

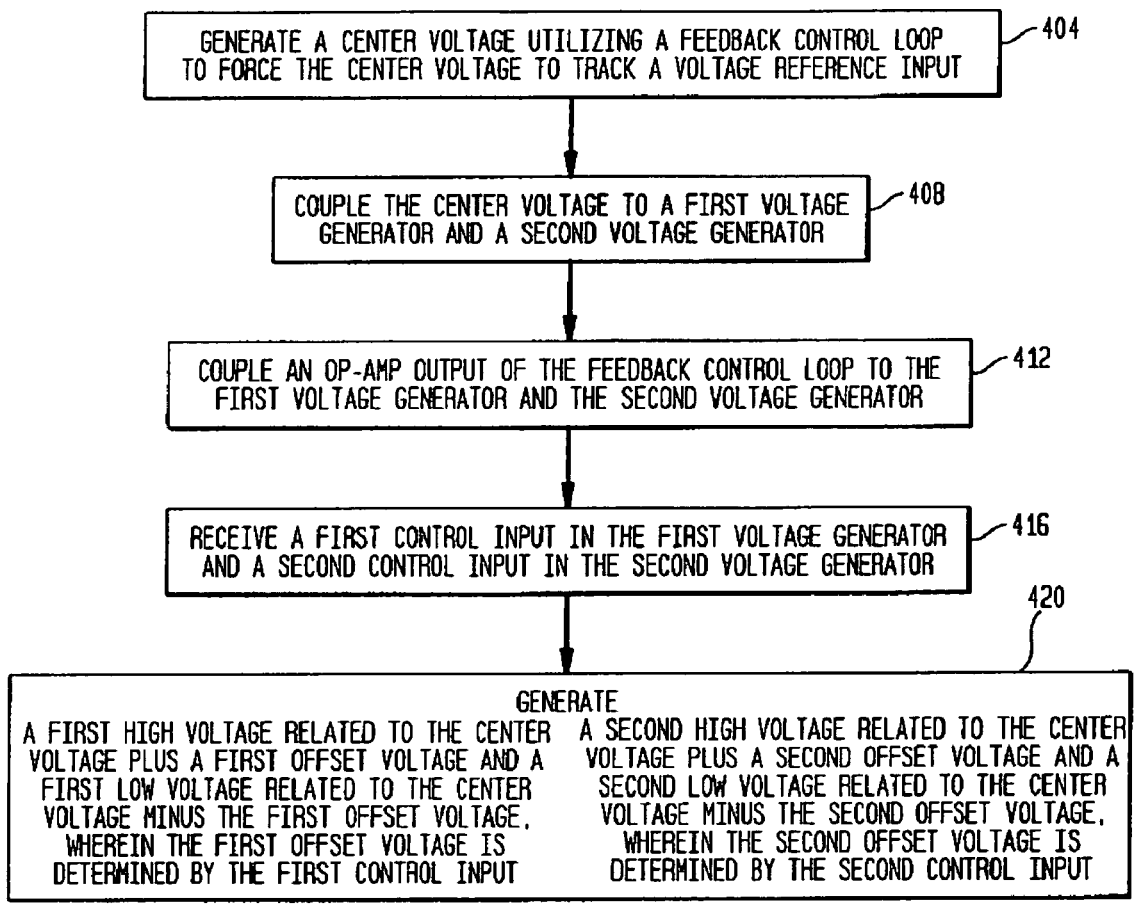

METHODS AND APPARATUS FOR REDUCED HARDWARE MULTIPLE VARIABLE VOLTAGE GENERATOR

FIELD OF INVENTION

The present invention relates generally to improved techniques for generating multiple variable voltages, and more particularly, to advantageous techniques for generating multiple variable voltages to be used as reference voltages having low implementation costs.

BACKGROUND OF INVENTION

Many system functions require a variable voltage reference to act as a threshold for a comparator or a latch to discriminate a time varying signal. One such system function is a serializer and deserializer (serdes). In one example, a parallel data path is encoded into a serialized data stream for transmission across a cable, or a circuit card, to an another chip or chips. In a receiver chip, the serialized data stream is received and decoded into a parallel data path. The serialization and deserialization process may use one or multiple variable voltage references in each serdes circuit to improve the accuracy of data acquisition to account for environmental effects, such as quality of connections, noise, temperature, and the like. With multiple serdes channels, the implementation cost and power associated with the components becomes increasingly important.

In one approach to providing multiple variable voltages, each time a voltage reference was needed a separate voltage reference circuit was implemented. Each voltage reference circuit typically used a feedback control circuit to generate the reference voltage and a relatively large bypass capacitor for the reference voltage. If a system function required two or more voltage references then two or more independent voltage reference circuits would be used. These independent voltage reference circuits would not track each other and could have different sources of errors, such as different offset errors generated from the independent feedback control circuits used. If the two or more voltage references needed to track each other, then more complex designs and more stringent component matching would be used.

SUMMARY OF INVENTION

Among its several aspects, the present invention recognizes that there is a need for generating multiple variable voltages each having a common reference point. By way of example, such circuits may be advantageously employed in a deserializer data acquisition system.

To these ends, an embodiment of the present invention includes a circuit having a feedback control generator, a first voltage generator, and a second voltage generator. The feedback control generator generates a center voltage. The first voltage generator generates a first high voltage related to the center voltage plus a first offset voltage and a first low voltage related to the center voltage minus the first offset voltage, wherein the first offset voltage is determined by a first control input to the first voltage generator. The second voltage generator generates a second high voltage related to the center voltage plus a second offset voltage and a second low voltage related to the center voltage minus the second offset voltage, wherein the second offset voltage is determined by a second control input to the second voltage reference generator.

Another embodiment of the present invention addresses a system for data acquisition having a preamplifier circuit, an acquisition subsystem, and a multiple reference generator. The preamplifier circuit generates a differential output and a common mode voltage. The acquisition subsystem acquiring data from the differential output based on multiple variable voltages used as reference voltages for data discrimination and generating a set of control signals. The multiple reference generator receiving the set of control signals and by use of a single feedback control loop generating a center voltage to track the common mode voltage and generating the multiple variable voltages based on the set of control signals and the center voltage.

Another embodiment of the present invention addresses a method of generating multiple reference voltages. A center voltage is generated by utilizing a feedback control loop to force the center voltage to track a voltage reference input. A first high voltage related to the center voltage plus a first offset voltage, a first low voltage related to the center voltage minus the first offset voltage, a second high voltage related to the center voltage plus a second offset voltage, and a second low voltage related to the center voltage minus the second offset voltage are generated, wherein the first offset voltage is determined by a first control input and the second offset voltage is determined by a second control input.

A more complete understanding of the present invention, as well as other features and advantages of the invention, will be apparent from the following detailed description, the accompanying drawings, and the claims.

BRIEF DESCRIPTION OF DRAWINGS

FIG. 4 illustrates a flow chart of a process of generating multiple voltages in accordance with the present invention.

DETAILED DESCRIPTION

The present invention will now be described more fully with reference to the accompanying drawings, in which several embodiments and various aspects of the invention are shown. This invention may, however, be embodied in various forms and should not be construed as being limited to the embodiments set forth herein. Rather, these embodiments are provided so that this disclosure will be thorough and complete, and will fully convey the scope of the invention to those skilled in the art.

Figure 1:
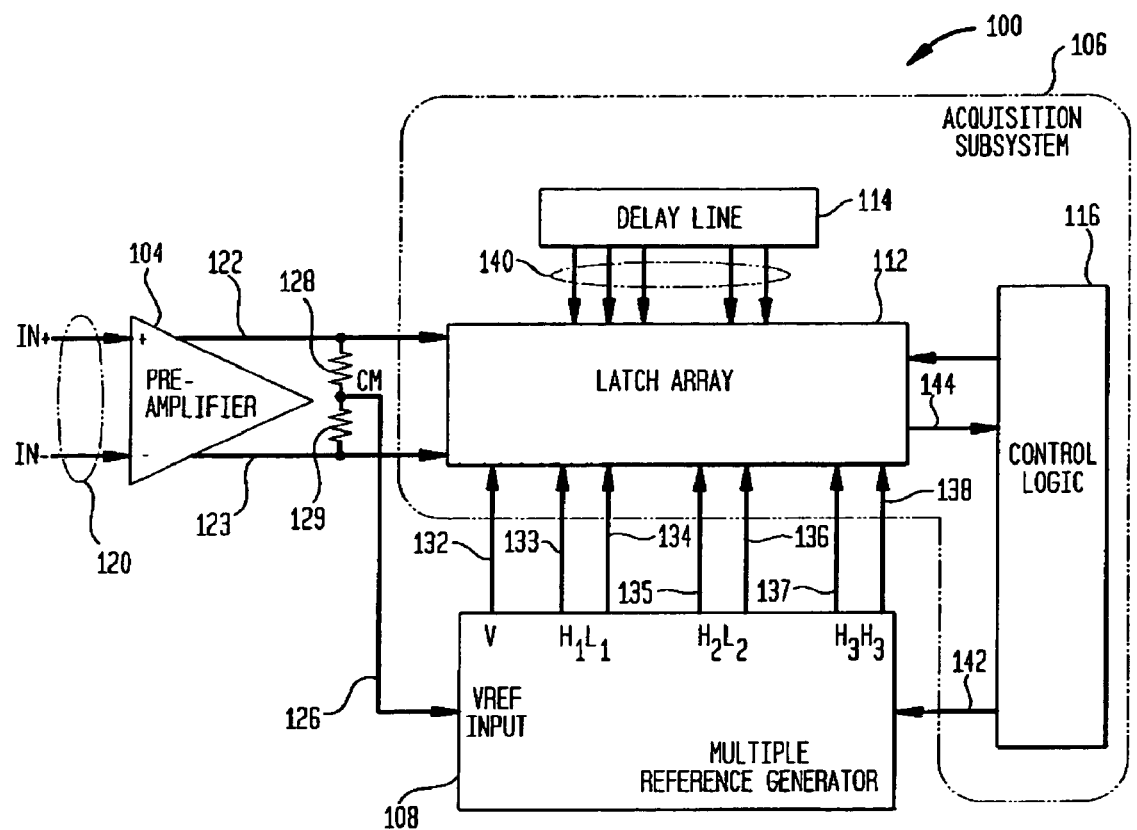
FIG. 1 illustrates a deserializer data acquisition system in accordance with the present invention.

FIG. 1 illustrates a deserializer data acquisition system 100 in accordance with the present invention. The deserializer data acquisition system 100 includes a preamplifier 104, an acquisition subsystem 106, and a multiple reference generator 108. The acquisition subsystem 106 contains a latch array 112, a delay line 114, and control logic 116. A serial data stream is received in preamplifier 104 as a differential input 120. The differential output signals 122 and 123 of the preamplifier 104 are connected to the latch array 112. Generally, the latch array 112 slices the output signals 122 and 123 to discriminate data in time and amplitude. A common mode (CM) voltage 126 is generated by resistors 128 and 129 connected to average the voltage at the output signals 122 and 123. The CM voltage 126 acts as a voltage reference (VREF) input to the multiple reference generator 108 and determines a zero crossing voltage. The latches internal to the latch array slice the output signals 122 and 123 at the zero crossing voltage and at a threshold above and at a threshold below the zero crossing voltage.

The multiple reference generator 108 produces a center voltage V 132, a first high voltage $H_1$ 133, a first low voltage $L_1$ 134, a second high voltage $H_2$ 135, a second low voltage $L_2$ 136, a third high voltage $H_3$ 137, and a third low voltage $L_3$ 138. The multiple voltages 132-138 are connected to the latch array 112. The delay line 114 provides timing signals 140 to the latch array 112. The control logic 116 provides control signals 142 to the multiple reference generator 108. For example, the control signals 142 may take the form of multi-bit binary control signals that are used to control individual voltage generators located in the multiple reference generator 108. The timing signals 140 specify slicing points in time for latches internal to the latch array 112. The latch array 112 generates output signals 144 that are connected to the control logic 116 for further processing.

Figure 2:
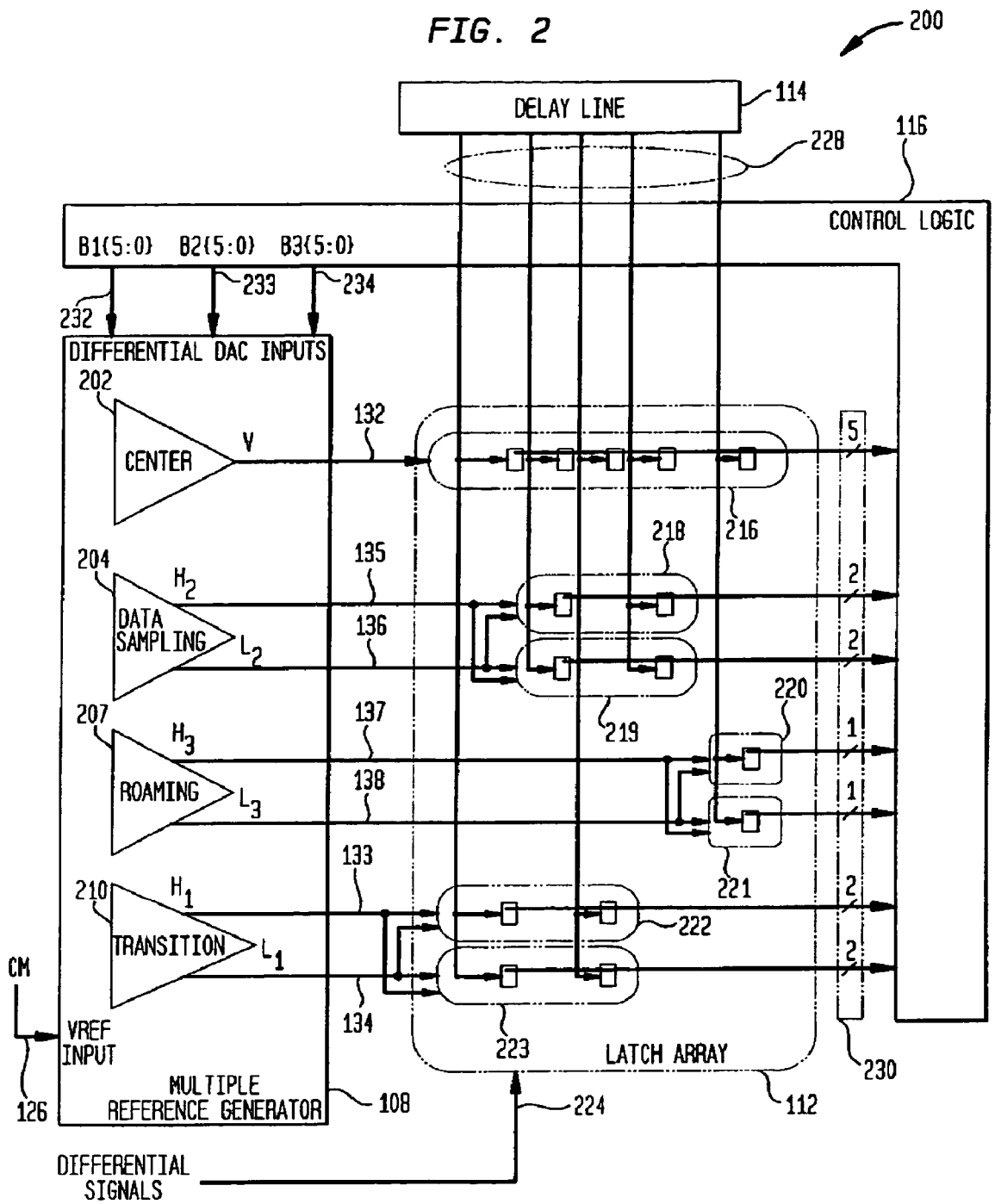
FIG. 2 illustrates a more detailed view of the deserializer data acquisition system of FIG. 1 in accordance with the present invention.

FIG. 2 illustrates a more detailed view of the deserializer data acquisition system 100 of FIG. 1 in accordance with the present invention. The multiple reference generator 108 consists of three voltage generators that generate six voltage outputs that are used as reference voltages in the latch array 112. A center zero crossing or center voltage V 132 is also generated. A data sampling voltage generator 204 generates the high voltage $H_2$ 135 and the low voltage $L_2$ 136. A roaming voltage generator 207 generates the high voltage $H_3$ 137 and the low voltage $L_3$ 138. A transition voltage generator 210 generates the high voltage $H_1$ 133 and the low voltage $L_1$ 134.

Latches in the latch array 112 are separated into four separate groups corresponding to the three voltage generators 204, 207, and 210 and the center voltage V 132. The center voltage V 132 is used as a threshold reference voltage for center latch group 216. The high voltage $H_2$ 135 and the low voltage $L_2$ 136 are used as threshold reference voltages for the data sampling latch groups 218 and 219. It is noted that the threshold reference voltages are used differentially. For upper threshold latches 218, the difference between the low voltage $L_2$ 136 minus the high voltage $H_2$ 135, sets the upper threshold level. For lower threshold latches 219, the difference between the high voltage $H_2$ 135 minus the low voltage $L_2$ 136 sets the lower threshold level.

The high voltage $H_3$ 137 and the low voltage $L_3$ 138 are used as threshold reference voltages for the roaming latch groups 220 and 221. The threshold reference voltages are used differentially. For upper threshold latch 220, the difference between the low voltage $L_3$ 138 minus the high voltage $H_3$ 137, sets the upper threshold level. For lower threshold latch 221, the difference between the high voltage $H_3$ 137 minus the low voltage $L_3$ 138, sets the lower threshold level.

The high voltage $H_1$ 133 and the low voltage $L_1$ 134 are used as threshold reference voltages for the transition latch group 222 and 223. The threshold reference voltages are used differentially. For upper threshold latches 222, the difference between the low voltage $L_1$ 134 minus the high voltage $H_1$ 133, sets the upper threshold level. For lower threshold latches 223, the difference between the high voltage $H_1$ 133 minus the low voltage $L_1$ 134, sets the lower threshold level.

The differential output signals 122 and 123 may be suitably employed as differential signals 224. Each of the internal latches compares the differential signals 224 to their respective threshold reference voltages and slices the differential signals 224 using timing signals 228. For example, the center latch group 216 slices the differential signals 224 at a zero crossing voltage level. The data sampling latch groups 218 and 219 slice the differential signals 224 at points in time when the data is stable. The roaming latch groups 220 and 221 slice the differential signals 224 at different points in time as determined by the control logic 116. The transition latch groups 222 and 223 slice the differential signals 224 at points in time when the data is transitioning to a one or to a zero value. The sliced data 230 is communicated to the control logic 116.

The latches in the latch array 112 may be all identical, but may vary depending upon design requirements. Generally, each latch receives the same differential signals 224 from the preamplifier 104, but each latch responds differently depending on how its threshold is set by its particular set of voltage references and the timing signal used to sample the input. Each latch has two sets of inputs, a differential input, positive and negative, for the data from the preamplifier 104 and a differential input, also positive and negative, for the voltage references from the multiple reference generator 108. For a latch with a positive threshold of 0.200V and a preamplifier with a common mode output of 0.750V, the preamplifier positive output would have to be greater than or equal to 0.850V, and the negative preamplifier output to less than or equal to 0.650V, for there to be a difference of at least 0.850V−0.650V=0.200V, before that latch would trip from a 0 to a 1. To set this latch's threshold to 0.200V, its reference voltages are set such that at its positive reference input we apply 0.650V, and at its negative reference input we apply 0.850V. This can be considered as applying a negative "pre-bias" of 0.650V−0.850V=−0.200V to that latch. When the differential voltage at its data input reaches at least 0.850v−0.650V=0.200V to overcome the negative 0.200V at its reference inputs, 0.200V−0.200V=0.000V, the latch trips. If the latch in this example is to have a negative 0.200V threshold, the voltage reference inputs are switched. Generally, the thresholds set in the upper threshold latches 218, 220, and 222 and lower threshold latches 219, 221, and 223, respectively, in each group are identical in magnitude but of opposite polarity with respect to the common mode voltage or zero crossing. Precise threshold reference voltages with minimum errors that track a common center voltage are utilized to insure accurate data discrimination.

The differential data inputs and the differential voltage reference inputs to the latches both have the same common mode (DC reference) voltage. The differential voltage references track the preamplifier output by varying the high and low voltages with respect to the center voltage, which is generated from the common mode (CM) voltage 126 of the preamplifier 104. The preamplifier common mode voltage and the multiple voltages 132-138 are tracked in the multiple reference generator 108, by a single feedback loop as described below.

The multiple reference generator 108 receives the common mode (CM) voltage 126 as a voltage reference (VREF) input, and three six bit control signals B1{5:0} 232, B2{5:0} 233, and B3{5:0} 234. The three six bit control signals 232-234 are used to control differential current steering digital to analog converters (DACs) shown in more detail in FIG. 3.

Figure 3:
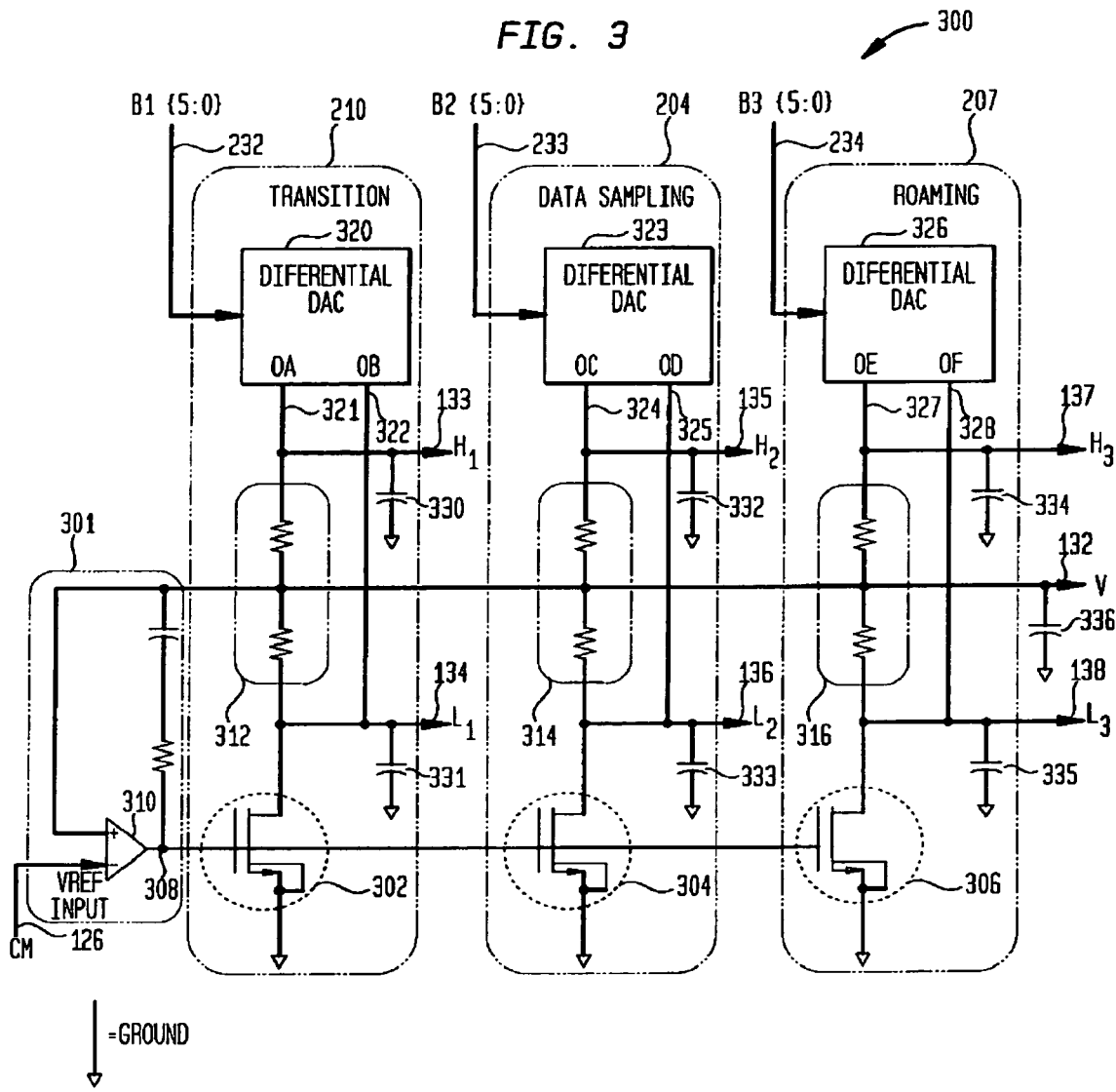
FIG. 3 illustrates a multiple voltage generator in accordance with the present invention.

FIG. 3 illustrates a multiple voltage generator 300 that may suitably be employed as the multiple reference generator 108 of FIGS. 1 and 2. The multiple voltage generator 300 is made up of the data sampling voltage generator 204, the roaming voltage generator 207, the transition voltage generator 210, and feedback control generator 301. While the multiple voltage generator 300 illustrates three voltage generators 204, 207, and 210, two voltage generators or more than three voltage generators may be implemented using the principles of the present invention. It will be recognized that a large number of voltage generators may be added beyond three voltage generators to meet anticipated future needs. For example, as chip densities and serial data rates increase, data acquisition subsystems may advantageously make use of additional voltage references for data discrimination functions. The limiting factor for adding voltage generators is feedback control loop stability and leakage current causing unacceptable errors.

Each voltage generator, 210, 204, and 207, is made up of a differential current steering DAC, 320, 323 and 326, a matched resistor stack, 312, 314 and 316, and a pull down N-channel device, 302, 304 and 306, respectively. The pull down N-channel devices 302, 304, and 306 are driven by the output 308 of operational amplifier (op-amp) 310. Each of the resistor stacks, 312, 314, and 316, is a voltage divider using two matched resistors with the center voltage V 132 connected to the middle of the resistor stack. The feedback control generator 301 uses the op-amp 310 and a feedback control loop to force the center voltage V 132 at the middle of each of the resistor stacks to be closely matched to the common mode (CM) voltage 126 which is received as a voltage VREF input. Each of the differential DACs 320, 323, and 326 positive output OA 321, OC 324, and OE 327 source current into the resistor stacks 312, 314, and 316 that is proportional to its input control signals B1{5:0} 232, B2{5:0} 233 and B3{5:0} 234, respectively. It is noted that each of the six bit input control signals 232-234 provides 64 levels of resolution, though a different number of control bits may be used depending upon the resolution and accuracy required and silicon area available. Each of the differential DACs 320, 323, and 326 negative output OB 322, OD 325, and OF 328, source the remainder of the total available DAC current that did not enter the resistor stack directly into the pull down devices 302, 304, and 306, respectively.

By combining the currents from the positive and negative outputs of a differential DAC into its associated pull down N-channel device, the operating current of the N-channel pull down device remains constant. Since the operating current of each N-channel pull down device remains constant during operation, multiple voltage generators can be attached together, sharing the feedback control generator 301, and the center voltage V 132. Since each of the N-channel pull down devices 302, 304 and 306 have a constant operating current, the separate voltage generators 210, 204, and 207, respectively, do not interact with each other, to the degree that the pull down devices match each other. The matching of the pull down N-channel devices 302, 304 and 306 is not a limiting factor or difficult to implement. The separate voltage generators 204, 207, and 210 operate independently with their respective high and low voltage outputs varying above and below the common center voltage V 132 according to their input control signals.

The setting of the control signals 232-234 is based on a characterization of the data channel as represented by the preamplifier outputs 122 and 123 and based on internally generated parameters. The roaming latches 220 and 221 are used to sample the data stream to determine the characteristics of the incoming signal and the data channel. The upper and lower data sampling latches 218 and 219 are placed at an appropriate level based on adaptive algorithms. The characteristics of the incoming signal are assessed real time in the control logic 116 to determine an optimum setting of the reference voltages.

By having one op-amp 310 and one center reference voltage V 132, the three reference generators 204, 207, and 210 are internally referenced to a single identical center reference voltage V 132. It is also noted that the multiple voltages 132-138 typically drive high impedance loads.

In a typical implementation, the center voltage V 132 is approximately 0.75 volts, the high voltages $H_1$ 133, $H_2$ 135, and $H_3$ 137 can be anywhere between 0 volts and 0.150 volts above the center voltage V 132, and the low voltages $L_1$ 134, $L_2$ 136, and $L_3$ 138 can be anywhere between 0 volts and 0.150 volts below the center voltage V 132. The resistors in the resistor stacks 312, 314, and 316 are of matched values and each are approximately 1 kilo-ohm (1 kΩ). The capacitors 330-336 can range between 3 pico-Farad (pF) and 6 pF, depending on allowable room in the specific implementation. The capacitors 330-336 are fabricated from thick gate oxide devices in order to keep their leakage current to a minimum. The power supply for the differential current steering DACs 320, 323, and 326 and op-amp 310 can vary between processing technologies and customer requirements. For example, 1.8 volts, 2.5 volts, or 3.3 volts are standard type supply voltages that may be used depending upon the processing technology and the design.

FIG. 4 illustrates a flow chart of a process 400 of generating multiple voltages in accordance with the present invention. In a first step 404, generate a center voltage utilizing a feedback control loop to force the center voltage to track a voltage reference input. In step 408, couple the center voltage to a first voltage generator and a second voltage generator. In step 412, couple an op-amp output of the feedback control loop to the first voltage generator and the second voltage generator. In step 416, receive a first control input in the first voltage generator and a second control input in the second voltage generator. In step 420, generate a first high voltage related to the center voltage plus a first offset voltage, a first low voltage related to the center voltage minus the first offset voltage, wherein the first offset voltage is determined by the first control input, a second high voltage related to the center voltage plus a second offset voltage, and a second low voltage related to the center voltage minus the second offset voltage, wherein the second offset voltage is determined by the second control input.

While the present invention has been disclosed in a presently preferred context, it will be recognized that the present teachings may be adapted to a variety of contexts consistent with this disclosure and the claims that follow. It will also be appreciated that variations in the particular hardware and controlling process employed are feasible, and to be expected as both evolve with time. For example, a state machine or software control mechanism may be used to set the values of the differential current steering DAC input control signals. As another example, a phase locked loop (PLL) circuit may be used instead of a delay line 114 to generate timing signals 140 to the latch array 112. Variations in the op-amp feedback control loop as used in the feedback control generator 301 and in the pull down devices, such as the pull down N-channel devices 302, 304, and 306, may also be expected due to variations in the implementation technology and the requirements for different products. Other such modifications and adaptations to suit a particular design application will be apparent to those of ordinary skill in the art.

I claim:

1. A circuit comprising:
   a feedback control generator generating a center voltage;
   a first voltage generator generating a first high voltage related to the center voltage plus a first offset voltage and a first low voltage related to the center voltage minus the first offset voltage, wherein the first offset voltage is determined by a first control input to the first voltage generator; and
   a second voltage generator generating a second high voltage related to the center voltage plus a second offset voltage and a second low voltage related to the center voltage minus the second offset voltage, wherein the second offset voltage is determined by a second control input to the second voltage reference generator.

2. The circuit of claim 1 wherein the feedback control generator comprises:
   an op-amp which receives a voltage reference and uses a feedback control loop to generate the center voltage to track the voltage reference.

3. The circuit of claim 1 wherein the first voltage generator comprises:
   a first resistor having a first end and a second end;
   a second resistor having a first end and a second end, the second resistor matched in value to the first resistor and the first end of the second resistor connected to the second end of the first resistor and to the center voltage;
   a first differential digital to analog converter (DAC) receiving the first control input, generating the first high voltage on a positive output connected to the first end of the first resistor, and generating the first low voltage on a negative output connected to the second end of the second resistor; and
   a first pull down device driven by the output of the op-amp and the conduction path of the first pull down device connected between ground and the second end of the second resistor.

4. The circuit of claim 3 wherein the first differential DAC generates a current into the first resistor that is proportional to the first control input.

5. The circuit of claim 1 wherein the second voltage generator comprises:
   a third resistor having a first end and a second end;
   a fourth resistor having a first end and a second end, the fourth resistor matched in value to the third resistor and the first end of the fourth resistor connected to the second end of the third resistor and to the center voltage;
   a second differential digital to analog converter (DAC) receiving the second control input, generating the second high voltage on a positive output connected to the first end of the third resistor, and generating the second low voltage on a negative output connected to the second end of the fourth resistor; and
   a second pull down device driven by the output of the op-amp and the conduction path of the second pull down device connected between ground and the second end of the fourth resistor.

6. The circuit of claim 5 wherein the second differential DAC generates a current into the third resistor that is proportional to the second control input.

7. The circuit of claim 1 further comprises:
   a third voltage generator generating a third high voltage related to the center voltage plus a third offset voltage and a third low voltage related to the center voltage minus the third offset voltage, wherein the third offset voltage is determined by a third control input to the third voltage reference generator.

8. The circuit of claim 7 wherein the third voltage generator comprises:
   a fifth resistor having a first end and a second end;
   a sixth resistor having a first end and a second end, the sixth resistor matched in value to the fifth resistor and the first end of the sixth resistor connected to the second end of the fifth resistor and to the center voltage;
   a third differential digital to analog converter (DAC) receiving the third control input, generating the third high voltage on a positive output connected to the first end of the fifth resistor, and generating the third low voltage on a negative output connected to the second end of the sixth resistor; and
   a third pull down device driven by the output of the op-amp and the conduction path of the third pull down device connected between ground and the second end of the sixth resistor.

9. The circuit of claim 8 wherein the third differential DAC generates a current into the fifth resistor that is proportional to the third control input.

10. The circuit of claim 7 wherein the center voltage, the first, the second, and the third high voltages, and the first, the second, and the third low voltages are used as reference voltages in a deserializer data acquisition system.

11. The circuit of claim 2 wherein the voltage input is a common mode voltage of a differential amplifier.

12. The circuit of claim 1 wherein the first high voltage and the first low voltage are used as reference voltages for signal transition detector latches.

13. The circuit of claim 1 wherein the second high voltage and the second low voltage are used as reference voltages for data sampling latches.

14. The circuit of claim 7 wherein the third high voltage and the third low voltage are used as reference voltages for signal roaming latches.

15. A system for data acquisition comprising:
   a preamplifier circuit generating a differential output and a common mode voltage;
   an acquisition subsystem for acquiring data from the differential output based on multiple variable voltages used as reference voltages for data discrimination and generating a set of control signals; and
   a multiple reference generator generating, by use of a single feedback control loop, a center voltage to track the common mode voltage and generating the multiple variable voltages based on the set of control signals and the center voltage.

16. The system of claim 15 wherein the multiple reference generator comprises:
   a first voltage generator generating a first high voltage that is a positive first offset amount from the center voltage and a first low voltage that is a negative first offset amount from the center voltage, wherein the first offset amount is determined by a first subset of the set of control signals; and
   a second voltage generator generating a second high voltage that is a positive second offset amount from the center voltage and a second low voltage that is a negative second offset amount from the center voltage, wherein the second offset amount is determined by a second subset of the set of control signals.

17. The system of claim 16 wherein the acquisition subsystem comprises:
   a latch array having a plurality of latches, wherein each latch in a first subset of latches receives the differential output and receives the first high voltage and the first low voltage to be used for discriminating the differential output and each latch in a second subset of latches receives the differential output and the second high voltage and the second low voltage to be used for discriminating the differential output.

18. A method of generating multiple variable voltages, the method comprising:

generating a center voltage by utilizing a feedback control loop to force the center voltage to track a voltage reference input; and generating a first high voltage related to the center voltage plus a first offset voltage, a first low voltage related to the center voltage minus the first offset voltage, a second high voltage related to the center voltage plus a second offset voltage, and a second low voltage related to the center voltage minus the second offset voltage, wherein the first offset voltage is determined by a first control input and the second offset voltage is determined by a second control input.

19. The method of claim 18 further comprising:

coupling the center voltage to a first voltage generator and to a second voltage generator;

coupling an op-amp output of the feedback control loop to the first voltage generator and to the second voltage generator; and receiving the first control input in the first voltage generator and the second control input in the second voltage generator.

20. The method of claim 19 further comprising:

responding to the op-amp output in the first voltage generator to pull down the first low voltage, wherein the first low voltage is acquired at the bottom of a resistor divider having the center voltage at the midpoint of the resistor divider and the first high voltage acquired at the top of the resistor divider; and responding to the op-amp output in the second voltage generator to pull down the second low voltage, wherein the second low voltage is acquired at the bottom of a resistor divider having the center voltage at the midpoint of the resistor divider and the second high voltage acquired at the top of the resistor divider.

* * * * *